US009859898B1

(12) United States Patent
Anderson et al.

(10) Patent No.: US 9,859,898 B1
(45) Date of Patent: Jan. 2, 2018

(54) HIGH DENSITY VERTICAL FIELD EFFECT TRANSISTOR MULTIPLEXER

(71) Applicant: INTERNATIONAL BUSINESS MACHINES CORPORATION, Armonk, NY (US)

(72) Inventors: Brent A. Anderson, Jericho, VT (US); Albert M. Chu, Nashua, NH (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 47 days.

(21) Appl. No.: 15/282,027

(22) Filed: Sep. 30, 2016

(51) Int. Cl.
| H03K 19/177 | (2006.01) |
| H01L 27/092 | (2006.01) |
| H01L 29/78 | (2006.01) |
| H01L 27/02 | (2006.01) |
| H03K 19/173 | (2006.01) |

(52) U.S. Cl.
CPC ... *H03K 19/17796* (2013.01); *H01L 27/0207* (2013.01); *H01L 27/092* (2013.01); *H01L 29/7827* (2013.01); *H03K 19/1737* (2013.01); *H03K 19/17704* (2013.01)

(58) Field of Classification Search
None
See application file for complete search history.

(56) References Cited

U.S. PATENT DOCUMENTS

| 5,962,881 | A   | * | 10/1999 | Young | H03K 17/693 |
|           |     |   |         |       | 257/202 |
| 6,297,989 | B1  | * | 10/2001 | Cloud | G11C 11/005 |
|           |     |   |         |       | 257/E21.209 |
| 7,605,604 | B1  | * | 10/2009 | Young | H03K 19/17736 |
|           |     |   |         |       | 326/38 |
| 7,635,989 | B1  | * | 12/2009 | Young | G06F 15/7867 |
|           |     |   |         |       | 326/39 |

(Continued)

FOREIGN PATENT DOCUMENTS

| EP | 0352523 A2 | 1/1990 |
| WO | 2015147832 A1 | 10/2015 |

OTHER PUBLICATIONS

"A competent design of 2:1 multiplexer and its application in 1-bit full adder cell" Amit Dubey; Sachin Dubey; Shyam Akashe Advance Computing Conference (IACC), 2013 IEEE 3rd InternationalYear: 2013; pp. 1519-1523, DOI: 10.1109/IAdCC.2013.6514452.

(Continued)

*Primary Examiner* — Alexander H Taningco
*Assistant Examiner* — Nelson Correa
(74) *Attorney, Agent, or Firm* — Cantor Colburn LLP; Vazken Alexanian

(57) ABSTRACT

A method for forming a multiplexor integrated circuit includes employing four complementary pairs of vertical field effect transistor (VFET) pairs, each of the complementary pairs of VFETs includes a first VFET device having a gate and a second VFET device having a gate, the gate of the first VFET device is connected to the gate of the second (Continued)

VFET device. The four complementary pairs VFET pairs are arranged to form a signal input portion of the multiplexor with four contact poly pitch (CPP) The plurality source/drain connections are operably connected.

13 Claims, 8 Drawing Sheets

(56) References Cited

U.S. PATENT DOCUMENTS

| | | | | |
|---|---|---|---|---|
| 7,888,959 | B2* | 2/2011 | Cannon | H03K 3/0375 |
| | | | | 324/762.01 |
| 8,076,236 | B2* | 12/2011 | Schultz | H01L 21/76895 |
| | | | | 257/E21.641 |
| 8,369,134 | B2 | 2/2013 | Singh et al. | |
| 9,202,820 | B1* | 12/2015 | Haigh | H01L 27/11807 |
| 2009/0039520 | A1 | 2/2009 | Tanaka et al. | |
| 2009/0045061 | A1* | 2/2009 | Farrow | B82Y 10/00 |
| | | | | 204/471 |

OTHER PUBLICATIONS

"A perspective review of tunnel field effect transistor with steeper switching behavior and low off current (IOFF) for ultra low power applications" A.Maria Jossy, T.Vigneswaran,International Journal of Engineering and Technology IJET, vol. 6, No. 5, Oct.-Nov. 2014, pp. 2092-2104; ISSN: 0975-4024.

"Analysis of the subthreshold characteristics of vertical tunneling field effect transistors" Han Zhongfang, Ru Guoping, Ruan Gang2013 Chinese Institute of ElectronicsJournal of Semiconductors, vol. 34, No. 1, pp. 014002-1 to 014002-7.

"Circuit and Architectural Co-design for Reliable Adder Cells with Steep Slope Tunnel Transistors for Energy Efficient Computing" Sadulla Shaik; K. Sri Rama Krishna; Ramesh Vaddi2016 29th International Conference on VLSI Design and 2016 15th International Conference on Embedded Systems (VLSID)Year: 2016; pp. 306-311, DOI: 10.1109/VLSID.2016.100.

"Ultra-low voltage implicit multiplexed differential flip-flop with enhanced noise immunity" W. -H. Sung; M. -C. Lee; C. -C. Chung; C. -Y. LeeElectronics Letters; Year: 2012, vol. 48, Issue: 23pp. 1452-1454, DOI: 10.1049/el.2012.3016.

* cited by examiner

HIGH DENSITY VERTICAL FIELD EFFECT TRANSISTOR MULTIPLEXER

BACKGROUND

The present invention relates to semiconductor devices, and more specifically, to fabrication methods and resulting structures for a multiplexer employing vertical field effect transistors FET.

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, leading to the fabrication of products with increased memory capacity. The drive for ever-more capacity, however, is not without issue. The necessity to optimize the power and performance of each device and tailoring to particular applications becomes increasingly significant. As demands to reduce the dimensions of transistor devices continue, new designs and fabrication techniques to achieve a reduced device footprint are developed. Vertical-type transistors such as vertical field effect transistors (VFETs) have recently been developed to achieve a reduced FET device footprint without compromising necessary FET device performance characteristics.

SUMMARY

According to an embodiment of the present invention, a method of forming a multiplexor integrated circuit includes employing four complementary pairs of vertical field effect transistor (VFET) devices, each complementary pair of VFET devices of the four complementary pairs of VFET devices including a first VFET device having a gate and a second VFET device having a gate, the gate of the first VFET device connected to the gate of the second VFET device. The four complementary pairs are arranged to form a signal input portion of the multiplexor with only four contact poly pitch (CPP). A plurality source/drain connections are operably interconnected.

According to another embodiment of the present invention, a method of forming a multiplexor integrated circuit includes employing four complementary pairs of vertical field effect transistor (VFET) devices, each complementary pair of VFET devices of the four complementary pairs of VFET devices including a first VFET device having a gate and a second VFET device having a gate, the gate of the first VFET device connected to the gate of the second VFET device. The four complementary pairs are arranged to form a the signal input portion of the multiplexor with four contact poly pitch (CPP), wherein the arranging results in at least two complementary pairs of vertical field effect transistor (VFET) devices, sharing adjacent source/drain interconnections to a power and a ground connection. A plurality of source/drain connections are operably interconnected.

According to yet another embodiment of the present invention, a multiplexor integrated circuit includes four complementary pairs of vertical field effect transistor (VFET) devices, each complementary pair of VFET devices of the four complementary pairs of VFET devices including a first VFET device having a gate and a second VFET device having a gate, where the gate of the first VFET device connected to the gate of the second VFET device; wherein the four pairs of complementary VFET are arranged with interconnections to form the signal input portion of the multiplexor with only four contact poly pitch (CPP).

DETAILED DESCRIPTION

Figure 1:
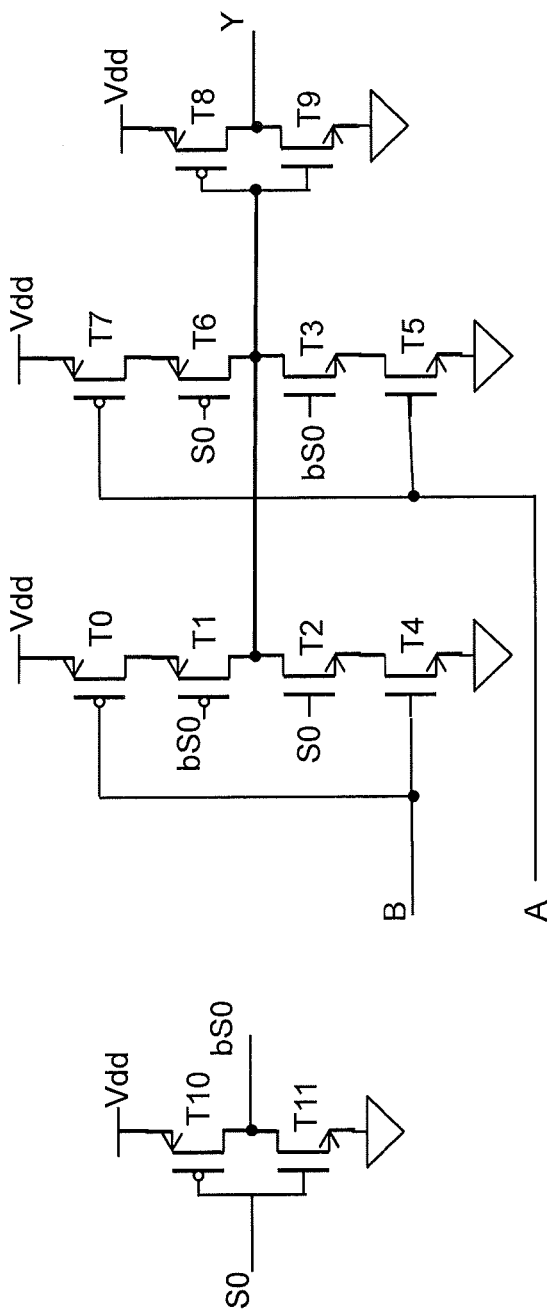
FIG. 1 is a schematic of a 2:1 multiplexor with a select input.

In the manufacture of planar integrated circuit devices, a metal oxide semiconductor field effect transistors (MOSFETs) can be used for multiplexor logic functions. However, the planar MOSFETs require crossing couple layers to provide the gate interconnections and have a common diffusion between drain and source resulting in a need of and use of dummy devices to provide isolation between stages in the logic circuits. Ultimately, the layout and configurations of the existing art result in an integrated circuit for a multiplexor that requires eight contact poly pitch (CPP), comprised of six active transistor pairs including two diffusion breaks to provide the required isolation between devices. Moreover, such configurations also require more complex multidirectional interconnections, particularly for the gate cross couple(s). Other configurations and layout for a multiplexer can be simplified some; to employ only unidirectional interconnections on any given layer of the integrated circuit. However, such configurations require an increase in size to nine (CPP) employing at least one dummy device to provide the required isolation between devices.

Vertical FETs facilitate design and fabrication of a multiplexer using a novel and unique device configuration that eliminates the need for dummy devices and cross couple interconnections and simplifies interconnections.

Generally, the embodiments described herein can be suitable for high performance or scaled transistors for dense logic devices having low power applications. A multiplexor based circuit (e.g., multiplexer, demultiplexor, adder, XOR, flip-flop, etc.) includes vertical field effect transistor (VFET) devices and utilizes the VFET's unique geometric characteristics to achieve a simplified and reduced footprint. In contemporary semiconductor device fabrication processes, a large number of semiconductor devices, such as metal oxide semiconductor field effect transistors (MOSFETs), are fabricated on a single wafer in a planar array. Some non-planar transistor device architectures, such as vertical field effect transistors (VFETs), employ semiconductor fins and side-gates that can be contacted outside the active region, resulting in increased device density and performance over lateral, planar devices. In contemporary VFET devices, in contrast to conventional FETs, the source to drain current flows through a vertical pillar in a direction that is perpendicular with respect to a horizontal major surface of the wafer or substrate. As a result VFET can achieve a smaller device footprint because its channel length is not defined by lithography, but rather by methods such as epitaxial growth or layer deposition, which can provide thickness control even at nanometer dimensions. In addition, the embodiments associated with the fabrication of an integrated circuit take advantage of the unique characteristic in VFETs that the drain and source do not share the same diffusion with the adjacent VFETs. As a result individual circuit elements can be arranged in a manner that diffusion breaks, dummy devices, and metal oxide layer cross couple interconnections are simplified or not necessary for isolation and as such the overall foot print required is reduced.

Multiplexor logic functions implemented with circuits having vertical field effect transistors (VFETs) are described. In the following description, numerous specific details are set forth, such as specific integration and material regimes, in order to provide a thorough understanding of the various embodiments. It will be apparent to one skilled in the art that embodiments can be practiced without these specific details. In other instances, well-known features, such as integrated circuit design layouts, are not described in detail in order to not unnecessarily obscure embodiments. Furthermore, it is to be understood that the various embodiments shown in the Figures are illustrative representations and are not necessarily drawn to scale.

With reference to FIG. 1, a schematic is provided of a 2:1 multiplexor with select input, employing Vertical Field Effect Transistors (VFET) devices. In this example twelve devices labeled T0-T12 are employed forming six pairs of complementary devices. Devices T10 and T11 form a selection input inverter connected to a select input and devices T8 and T9 form an output inverter with the output of the multiplexor labeled Y. Devices T0-T7 form the data input and selection section for multiplexing the two data inputs labeled A and B. The remaining discussion will focus on devices T0-T7 and their arrangement and interconnection.

Figure 2:
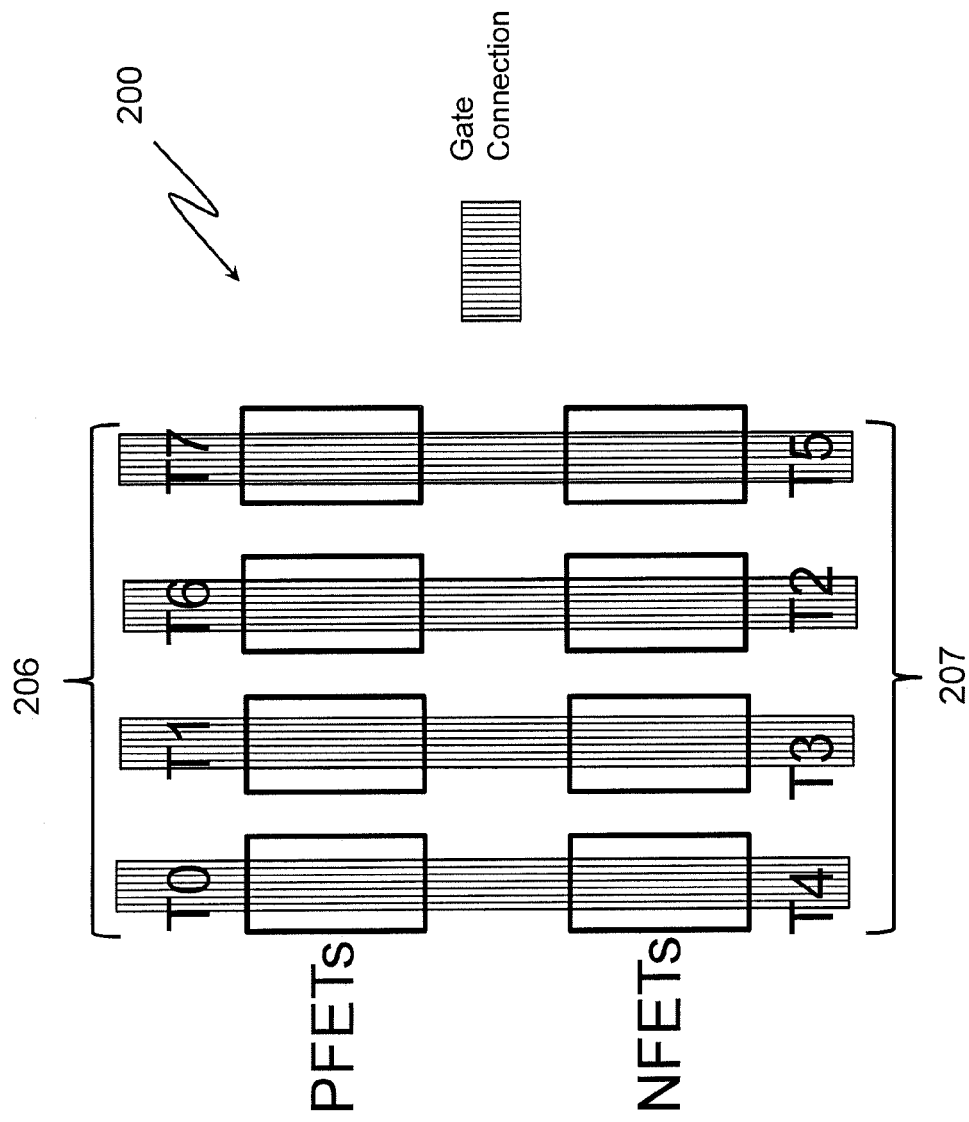
FIG. 2 is a simplified view of the arrangement of a portion the circuit elements in a in accordance with an embodiment.

Turning now to FIG. 2, a simplified layout for the multiplexor 200 of an embodiment is depicted. a simplified view representative of an arrangement and structure for the multiplexor integrated circuit 100 and the interconnections on various layers is depicted. The structure 200 corresponds to the schematic of FIG. 1, but omits the select input inverter (T10 & T11) for and output inverter (T8 & T9) for clarity. In conventional integrated circuits, the layout and arrangement of the transistors is generally configured to maximize sharing of the diffusion. In an embodiment, the transistors T0-T7 of the multiplexor circuit 200 are arranged to improve the layout specifically taking advantage of the unique features of the VFET. In particular, the isolation of the source and drain nodes from adjacent transistors in the VFET CMOS devices. The pFETs T0, T1, T6 and T7 are arranged in row on one layer of the IC and the nFETS T4, T3, T2, and T5 are arranged in a row on one layer of the IC, typically the same as the p-FETs. As depicted in the Figure, the gate terminals 206 corresponding to the four pFETS and 207 corresponding to the four nFETS are all on one layer, and connected in pairs. With the transistor gate terminals for T0 and T4 being tied together, T1 and T3, T6 and T2 and likewise T7 and T5. Advantageously, this arrangement eliminates the need for gate cross couple connections as are typically required for planar devices for the gate terminals and moreover, the connection for each pair is also a unidirectional connection, advantageously, on a single layer of the IC.

Figure 3:
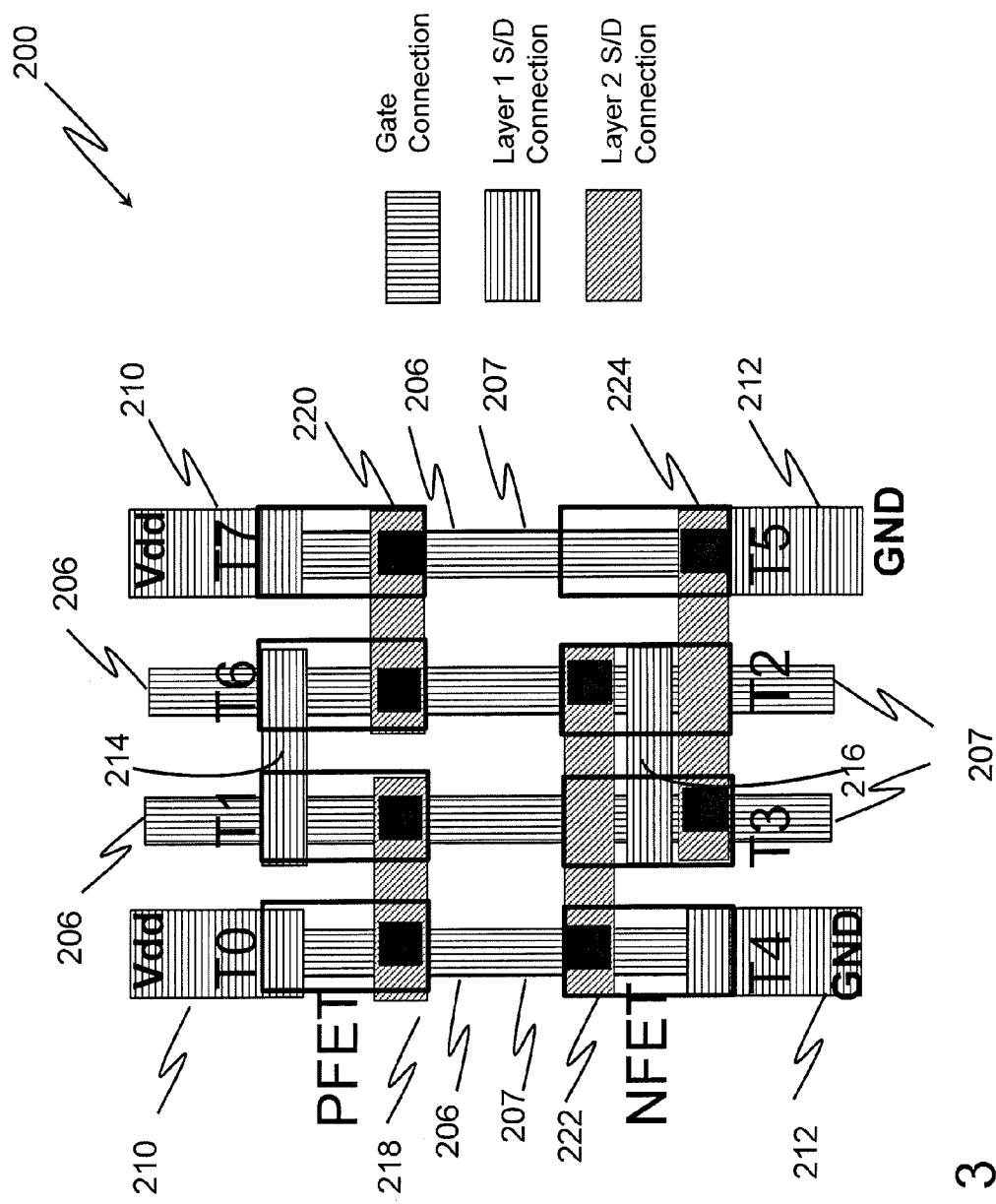
FIG. 3 is a simplified view of the arrangement of a portion the circuit elements showing source/drain interconnections in a in accordance with an embodiment.

Turning now to FIG. 3 as well and continuing with the arrangement and layout of an embodiment of the multiplexor 200, the Source and Drain (S/D) connections for each VFET can readily be completed, by taking advantage of the isolation between each of the VFET devices T0-T7. Once again, the connections for each arrangement are unidirectional and easily limited to two layers. On a first layer the S/D connections are made for T0 and T7 to Vdd as depicted by 210 and likewise for T4 and T5 to ground as shown by reference numeral 212. In addition, the S/D interconnection between T1 and T6 is depicted at 214. Finally for the source/drain connections between T3 and T2 as depicted at 216. In an embodiment, on another layer the remainder of S/D interconnections completes the circuit. On the pFET portion of the multiplexor circuit 200, at 218 the connection from T0 to T1 is completed and likewise the connection from T6 to T7 as shown at 220. For the nFET side of the simplified layout of the multiplexor 200, the S/D connection between T4 and T2 is depicted at 222 while the connection between T3 and T5 is depicted at 224. While in an embodiment the S/D interconnections are described as being completed on two layers of the integrated circuit, it will be appreciated that any variety of combinations is possible. The configuration depicted in the figures is meant to be illustrative, a single layer or additional layers could be employed to make the interconnections if desired.

Figure 4:
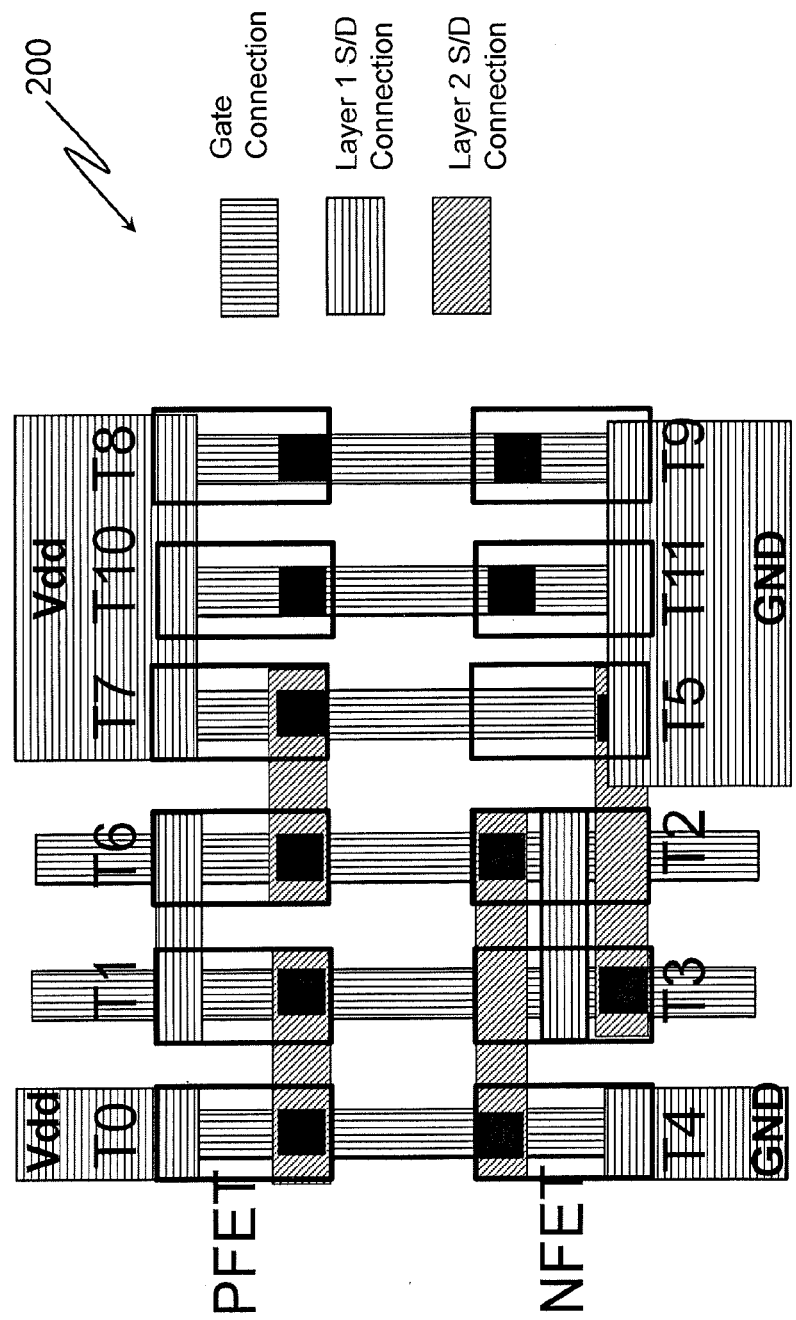
FIG. 4 is a simplified view of the arrangement of the circuit elements of FIG. 3 also depicting select input and output inverter transistors in accordance with an embodiment.

FIG. 4 depicts a simplified structure and layout for the complete circuit of a 2:1 multiplexor corresponding to the schematic of FIG. 1 including the input and output inverters formed by the T10-T11 and T8-T9 transistor pairs. Taking advantage of the features of the VFET permits layout of the each pair of transistors immediately adjacent to another without having to provide for isolation, dummy devices or bi-directional cross couples as is required in the existing art. The unique rearrangement of the embodiments permits layout of the complete 2:1 multiplexor of the schematic of FIG. 1 with a reduced integrated circuit cell width of just 6 contact poly pitch (CPP). The result is reduction in the area required to implement the multiplexor as well as a significant simplification in the interconnections required between the transistors to employ only unidirectional interconnections.

Figure 5:
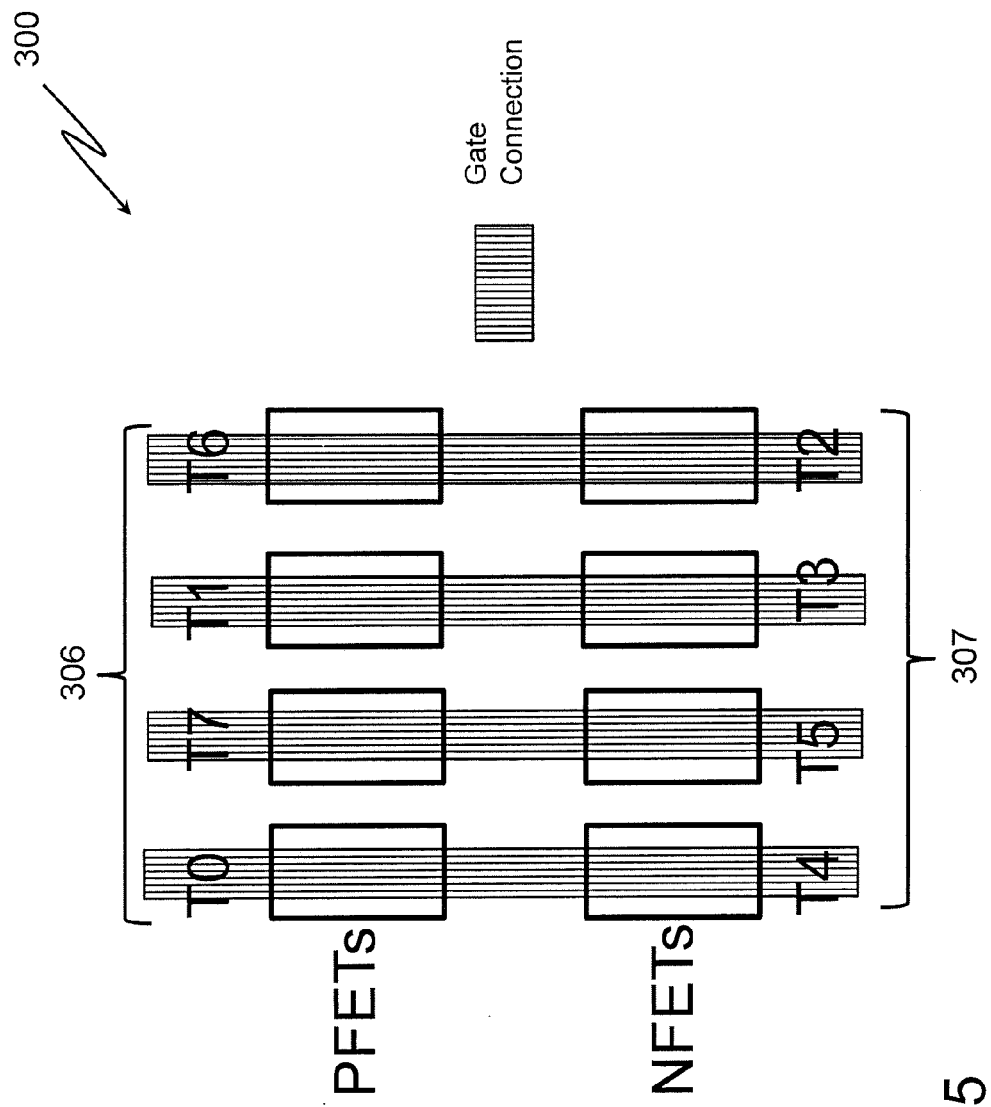
FIG. 5 is a simplified view of the arrangement of a portion the circuit elements in a in accordance with another embodiment.

Turning now to FIG. 5 and with continued reference to FIGS. 1-4 as well, a simplified diagram of the layout and arrangement for the multiplexor 300 corresponding to that of multiplexor schematic of FIG. 1 of another embodiment is depicted. It will be appreciated that similar features and functions as described earlier with respect to an embodiment are also applicable to the other embodiments and in this instance with the reference numerals increased by 100 once again.

Once again, in an embodiment, the transistors T0-T7 of the multiplexor circuit as depicted in FIG. 1 are arranged to improve the layout specifically taking advantage of the unique features of the VFET. The layout is still similar to that of the arrangement in multiplexor 200 with the pFETs T0, T1, T6, and T7 all arranged in a row and the nFETs T4, T2, T3, and T5 also arranged in a row. As depicted in the Figure, the gate terminals 306 corresponding to the four pFETS and 307 corresponding to the four nFETS are all on one layer, and connected in pairs. With the terminals for T0 and T4 being tied together, T1 and T3, T6 and T2 and likewise T7 and T5. Once again, advantageously, this arrangement eliminates the need for gate cross couple connections as are typically required for planar devices for the gate terminals and moreover, the connection for each pair is also a unidirectional connection, advantageously, on a single layer of the IC.

Continuing with FIG. 5, in an embodiment the arrangement of the multiplexor 300 is further simplified by shifting the T7-T5 transistor pair to the left and placing it adjacent to the T0-T4 pair. Advantageously as will be seen, this approach further simplifies the layout when the S/D connections are completed as described below.

Figure 6:
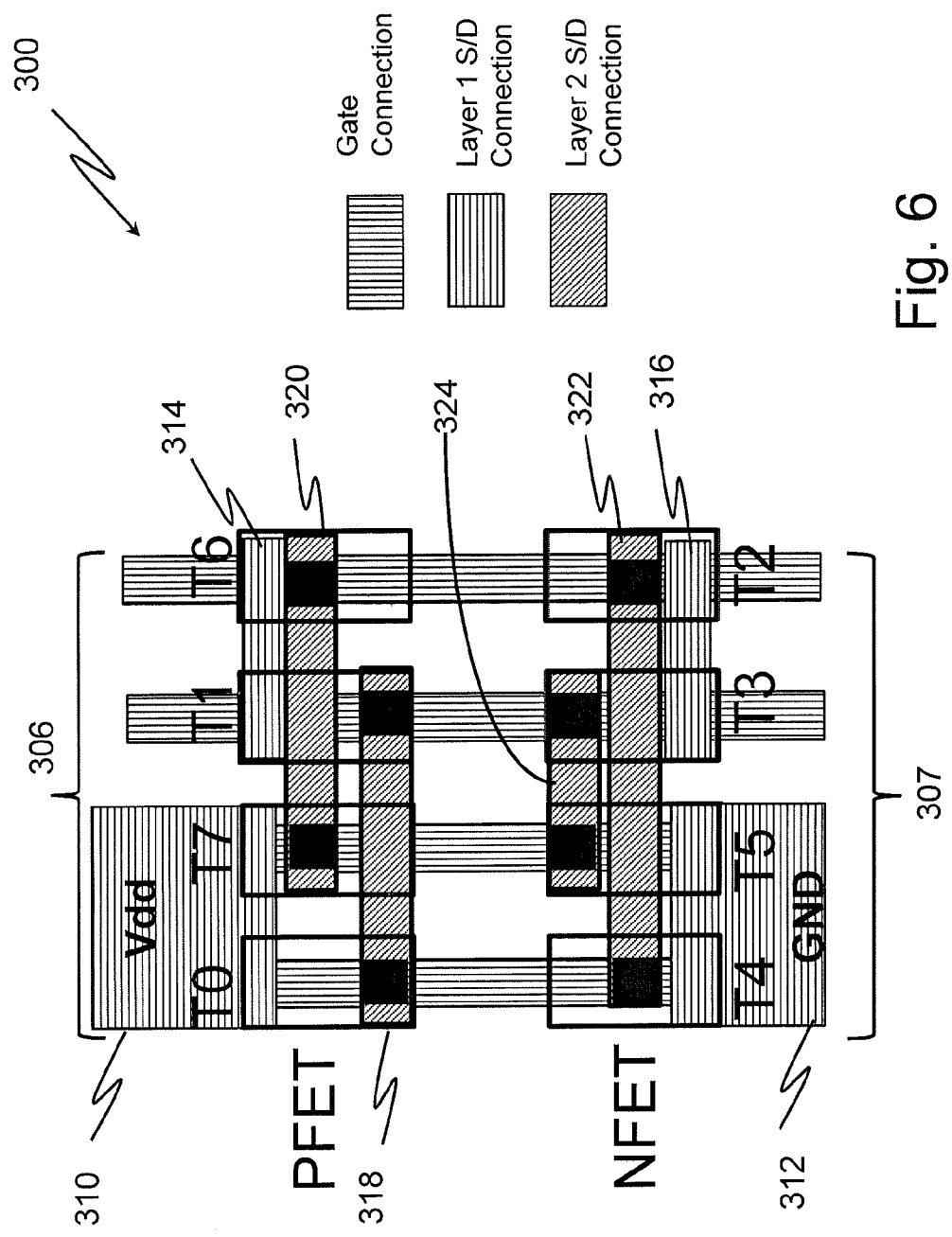
FIG. 6 is a simplified view of the arrangement of a portion the circuit elements showing source/drain interconnections in a in accordance with an embodiment.

Turning now to FIG. 6 as well and continuing with the arrangement and layout of an embodiment of the multiplexor 300, the Source and Drain (S/D) connections for each VFET can readily be completed, by taking advantage of the isolation between each of the VFET devices T0-T7. Advantageously, once again, the connections for each arrangement are unidirectional and readily limited to two layers. On a first layer the S/D connections are made for T0 and T7 to Vdd as depicted by 310 and likewise for T4 and T5 to ground as shown by reference numeral 312. It should be noted that in this embodiment, the shifting of the T7-T5 pair adjacent to the T0-T4 pair has simplified the interconnections for power and ground and permits a larger connection area as it spans the area of two devices. Advantageously this makes the connection easier to fabricate and reduces the contact resistance for the power connection to the circuit. In addition, the S/D interconnection between T1 and T6 is depicted at 314. Finally for the source/drain connections between T3 and T2 as depicted at 316. In an embodiment, on another layer the remainder of S/D interconnections completes the circuit for the multiplexor 300. On the pFET portion of the multiplexor circuit 300, at 318 the connection from T0 to T1 is completed and likewise the connection from T6 to T7 as shown at 320. For the nFET side of the simplified layout of the multiplexor 300, the S/D connection between T4 and T2 is depicted at 322 while the connection between T3 and T5 is depicted at 224. Once again, while in an embodiment the S/D interconnections are described as being completed on two layers of the integrated circuit, it will be appreciated that any variety of combinations is possible. The configuration depicted in the figures is meant to be illustrative, a single layer or additional layers could be employed to make the interconnections if desired.

Figure 7:
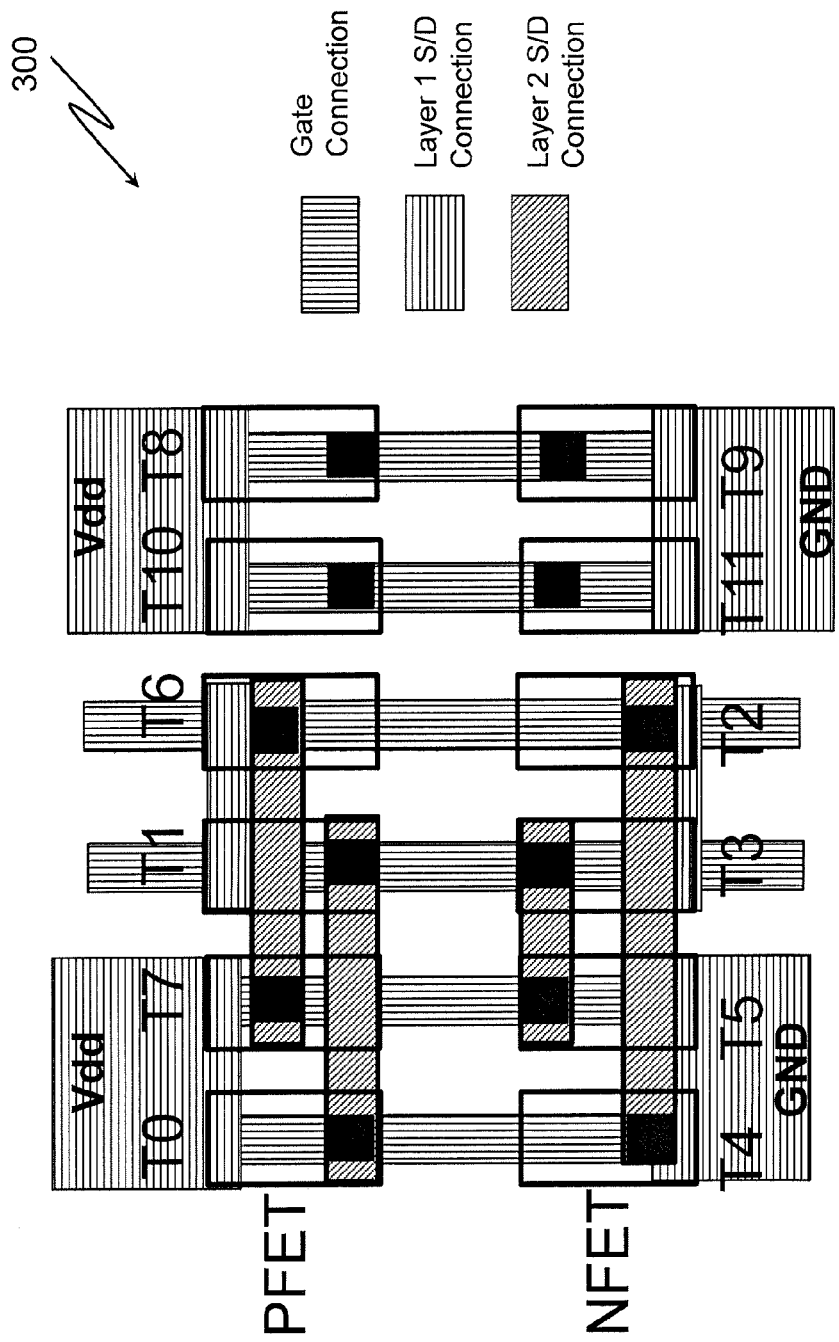
FIG. 7 is a simplified view of the arrangement of the circuit elements of FIG. 6 also depicting select input and output inverter transistors in accordance with an embodiment.

FIG. 7 depicts a simplified structure and layout for the complete circuit of a 2:1 multiplexor corresponding to the schematic of FIG. 1 including the input and output inverters formed by the T10-T11 and T8-T9 transistor pairs. Advantageously once again, taking advantage of the features of the VFET permits layout of the each pair of transistors immediately adjacent to another without having to provide for isolation, dummy devices or bi-directional cross couples as is required in the existing art. The unique arrangement of the described embodiments permits layout of the complete 2:1 multiplexor of the schematic of Figure one with a reduced integrated circuit cell width of just 6 contact poly pitch (CPP). Advantageously, the result is reduction in the area required to implement the multiplexor as well as a significant simplification in the interconnections required between the transistors.

Figure 8:
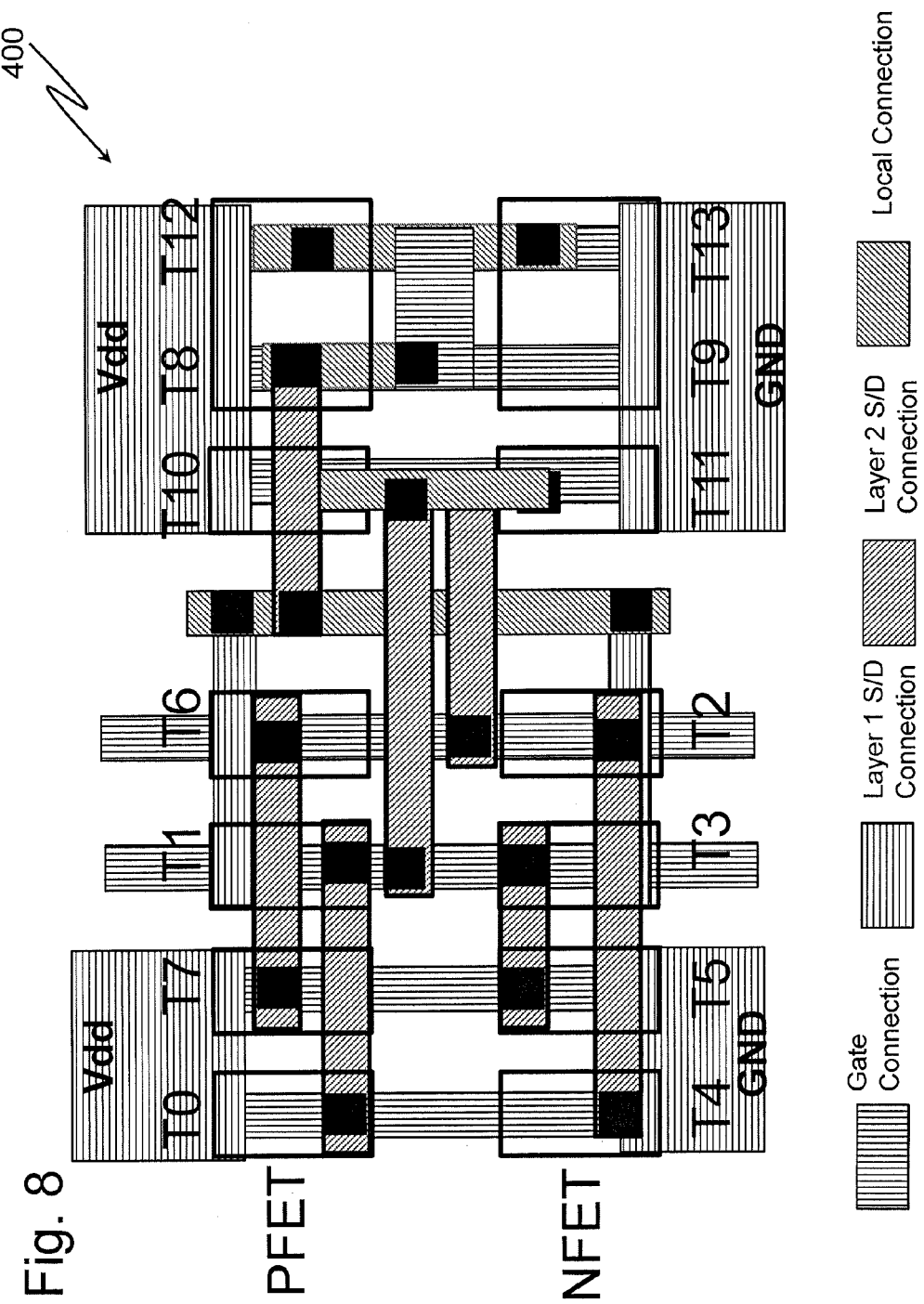
FIG. 8 is a simplified view of the arrangement of the circuit elements of FIG. 7 also depicting select input and output inverter transistors in accordance with an embodiment.

Turning now to FIG. 8, where a simplified structure and layout for the complete circuit of a 2:1 multiplexor corresponding the schematic of FIG. 1 including the input and output inverters formed by the T10-T11 and T8-T9 transistor pairs. On another embodiment is depicted. In the embodiment an additional transistor pair T12 and T13 is added in parallel to the output inverter formed by T8 and T9. Taking advantage of the features of the VFET permits layout of the each pair of transistors immediately adjacent to another without having to provide for isolation, dummy devices or bi-directional cross couples as is required in the existing art. In this embodiment, the power output drive of the multiplexor circuit 400 is readily doubled. The unique rearrangement of the described embodiments permits layout of the complete 2:1 multiplexor of the schematic of FIG. 1 but with twice to output current capacity with a reduced integrated circuit cell width of just 7 contact poly pitch (CPP). As a result is reduction in the area required to implement the multiplexor as well as a significant simplification in the interconnections required between the transistors.

Various embodiments of the present invention are described herein with reference to the related drawings. Alternative embodiments can be devised without departing from the scope of the invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present invention to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

The term "exemplary" is used herein to mean "serving as an example, instance, or illustration." Any embodiment or design described herein as "exemplary" is not necessarily to be construed as preferred or advantageous over other embodiments or designs. The terms "a", "at least one" and "one or more" can be understood to include any integer number greater than or equal to one, i.e. one, two, three, four, etc. The terms "a plurality" can be understood to include any integer number greater than or equal to two, i.e. two, three, four, five, etc. The term "connection" can include both an indirect "connection" and a direct "connection."

References in the specification to "one embodiment," "an embodiment," "an example embodiment," etc., indicate that the embodiment described can include a particular feature, structure, or characteristic, but every embodiment can or cannot include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

For the sake of brevity, conventional techniques related to semiconductor device and IC fabrication are not be described in further detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the combination of operations and/or resulting structures of the present invention are unique. Thus, the unique combination of the operations described in connection with the fabrication of a coupler system according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a multiplexor integrated circuit, the method comprising:
    employing four complementary pairs of vertical field effect transistor (VFET) devices, each complementary pair of VFET devices of the four complementary pairs of VFET devices including a first VFET device having a gate and first source/drain regions and a second VFET device having a gate and second source/drain regions, wherein the gate of the first VFET device is connected to the gate of the second VFET device;
    arranging the four complementary pairs to form a signal input portion of the multiplexor with four contact-to-poly pitch (CPP);
    interconnecting a plurality of the first source/drain regions to each other;
    interconnecting a plurality of the second source/drain regions to each other; and
    interconnecting at least one of the first source/drain regions to at least one of the second source/drain regions.

2. The method according to claim 1, further comprising employing another pair of complementary vertical field effect transistor (VFET) devices, wherein the another pair of complementary of vertical field effect transistor (VFET) devices is arranged as a select input inverter.

3. The method according to claim 2, further comprising employing another pair of complementary vertical field effect transistor (VFET) devices, wherein the another pair of complementary vertical field effect transistor (VFET) devices is arranged as an output inverter.

4. The method according to claim 3 wherein the arranging results in a 2:1 multiplexor.

5. The method according to claim 1 wherein the arranging does not include a gate cross-couple.

6. The method according to claim 1 wherein the arranging results in at least two complementary pairs of vertical field effect transistor (VFET) devices sharing adjacent source/drain region interconnections to a power and a ground connection.

7. The method according to claim 1, further comprising employing another pair of complementary vertical field effect transistor (VFET) devices, wherein the another pair of complementary vertical field effect transistor (VFET) devices is connected in parallel to a pair of vertical field effect (VFET) devices arranged as an output inverter to increase output drive capability of the multiplexor.

8. A multiplexor integrated circuit comprising:
four complementary pairs of vertical field effect transistor (VFET) devices, each complementary pair of VFET devices of the four complementary pairs of VFET devices including a first VFET device having a gate and first source/drain regions and a second VFET device having a gate and second source/drain regions, wherein the gate of the first VFET device is connected to the gate of the second VFET device, a plurality of the first source/drain regions are interconnected to each other, a plurality of the second source/drain regions are interconnected to each other, and at least one of the first source/drain regions is interconnected to at least one of the second source/drain regions;

wherein the four pairs of complementary VFET devices are arranged with interconnections to form a signal input portion of the multiplexor with four contact-to-poly pitch (CPP).

9. The multiplexor integrated circuit according to claim 8, further comprising another pair of complementary vertical field effect transistor (VFET) devices, wherein the another pair of complementary vertical field effect transistor (VFET) devices is arranged as a select input inverter.

10. The multiplexor integrated circuit according to claim 9, further comprising another pair of complementary vertical field effect transistor (VFET) devices, wherein the another pair of complementary vertical field effect transistor (VFET) devices is arranged as an output inverter.

11. The multiplexor integrated circuit according to claim 10, wherein the multiplexor integrated circuit forms a 2:1 multiplexor.

12. The multiplexor integrated circuit according to claim 8, wherein the multiplexor is formed without a gate cross-couple.

13. The multiplexor integrated circuit according to claim 8, wherein two complementary pairs of vertical field effect transistor (VFET) devices share adjacent source/drain interconnections to a power and a ground connection.

* * * * *